United States Patent
Kovac

(10) Patent No.: US 9,281,786 B2
(45) Date of Patent: Mar. 8, 2016

(54) INPUT POWER DETECTING ARRANGEMENT AND METHOD

(71) Applicant: Peregrine Semiconductor Corporation, San Diego, CA (US)

(72) Inventor: David Kovac, Arlington Heights, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 133 days.

(21) Appl. No.: 13/958,432

(22) Filed: Aug. 2, 2013

(65) Prior Publication Data

US 2015/0035593 A1 Feb. 5, 2015

(51) Int. Cl.
| | |
|---|---|
| *H03F 1/14* | (2006.01) |
| *H03F 3/189* | (2006.01) |
| *H03F 1/02* | (2006.01) |
| *H03F 3/72* | (2006.01) |
| *H03F 3/04* | (2006.01) |

(52) U.S. Cl.
CPC .............. *H03F 3/189* (2013.01); *H03F 1/0277* (2013.01); *H03F 3/04* (2013.01); *H03F 3/72* (2013.01); *H03F 2200/228* (2013.01); *H03F 2200/465* (2013.01)

(58) Field of Classification Search
CPC . H03F 2200/451; H03F 3/189; H03F 1/0233; H03F 3/19; H03F 1/0222; H03F 3/211; H03F 3/213; H03F 3/245; H03F 3/45071; H03F 1/0277; H03F 2003/45008; H03F 2003/45017; H03F 2200/111; H03F 2200/42
USPC .................................... 330/51, 136, 310, 311
See application file for complete search history.

(56) References Cited

U.S. PATENT DOCUMENTS

| | | | |
|---|---|---|---|
| 7,486,135 B2* | 2/2009 | Mu ................................. | 330/51 |
| 7,656,227 B1* | 2/2010 | Beaudoin et al. ............... | 330/51 |
| 7,795,968 B1 | 9/2010 | Li et al. | |
| 7,812,672 B2* | 10/2010 | Lee et al. ....................... | 330/136 |
| 7,839,216 B2* | 11/2010 | Alidio et al. .................. | 330/295 |
| 2002/0145469 A1* | 10/2002 | Charley et al. ................. | 330/51 |
| 2014/0266433 A1 | 9/2014 | Nobbe et al. | |
| 2014/0266460 A1 | 9/2014 | Nobbe et al. | |

* cited by examiner

*Primary Examiner* — Khanh V Nguyen
(74) *Attorney, Agent, or Firm* — Jaquez Land Richman LLP; Martin J. Jaquez, Esq.; Alessandro Steinfl, Esq.

(57) ABSTRACT

An amplifier circuit with an input power detector and a related method are described. With the input power detector and related control network, the arrangement enables and/or disables a number of unit cells in power amplifiers.

23 Claims, 4 Drawing Sheets

US 9,281,786 B2

INPUT POWER DETECTING ARRANGEMENT AND METHOD

BACKGROUND

1. Field

The present disclosure relates to power amplifiers. In particular, the present disclosure relates to an input power detector and related arrangements and methods.

2. Description of Related Art

Amplifiers can be used to increase a power of a variety of signals. The amount of amplification can be dependent on the design of the different amplifiers. In situations where a particular amplifier do not need to use all of its power to amplify a given signal (e.g. the signal does not need to be amplified to the maximum extent of that amplifier), the excess power is unused and wasted, which in turn reduces the power efficiency of the amplifiers. It can be desired that the amplifiers operate as efficiently as possible despite obtaining a varying number of input signals and varying degrees of amplification.

SUMMARY

According to a first aspect, an arrangement is described, the arrangement comprising one or more power amplifiers, each power amplifier comprising a plurality of unit cells, the one or more power amplifiers adapted to amplify an input signal; an input power detector separate from the signal generator, the input power detector coupled with the signal generator and adapted to determine a power level of the input signal at an input of the one or more power amplifiers; and a control network separate from the signal generator and connected with the input power detector, the control network determining, upon receipt of the power level of the input signal, a number of unit cells to disable or enable and then send control signals to the plurality of unit cells of each power amplifier to independently enable and/or disable the unit cells based on the determined number of unit cells.

According to a second aspect, a method is described, the method comprising: generating an input signal from a signal generator; providing one or more power amplifiers adapted to amplify the generated input signal, wherein each power amplifier comprises a plurality of unit cells; feeding the input signal to an input power detector; detecting a power level from the fed input signal; determining an amplification level for the one or more power amplifiers based on the detected power level; sending control signals to one or more unit cells of the plurality of unit cells of the one or more power amplifiers to enable or disable one or more unit cells, which control the amplification level with respect to the detected power level; and amplifying the input signal through the enabled unit cells of the one or more power amplifiers.

Further aspects of the disclosure are provided in the specification, claims and drawings of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

The term "amplifier" as used in the present disclosure is intended to refer to amplifiers comprising single or stacked transistors configured as amplifiers, and can be used interchangeably with the term "power amplifier" or "PA". Such amplifiers and power amplifiers can be applicable to amplifiers and power amplifiers of any stages (e.g., pre-driver, driver, final), known to those skilled in the art.

Figure 1:
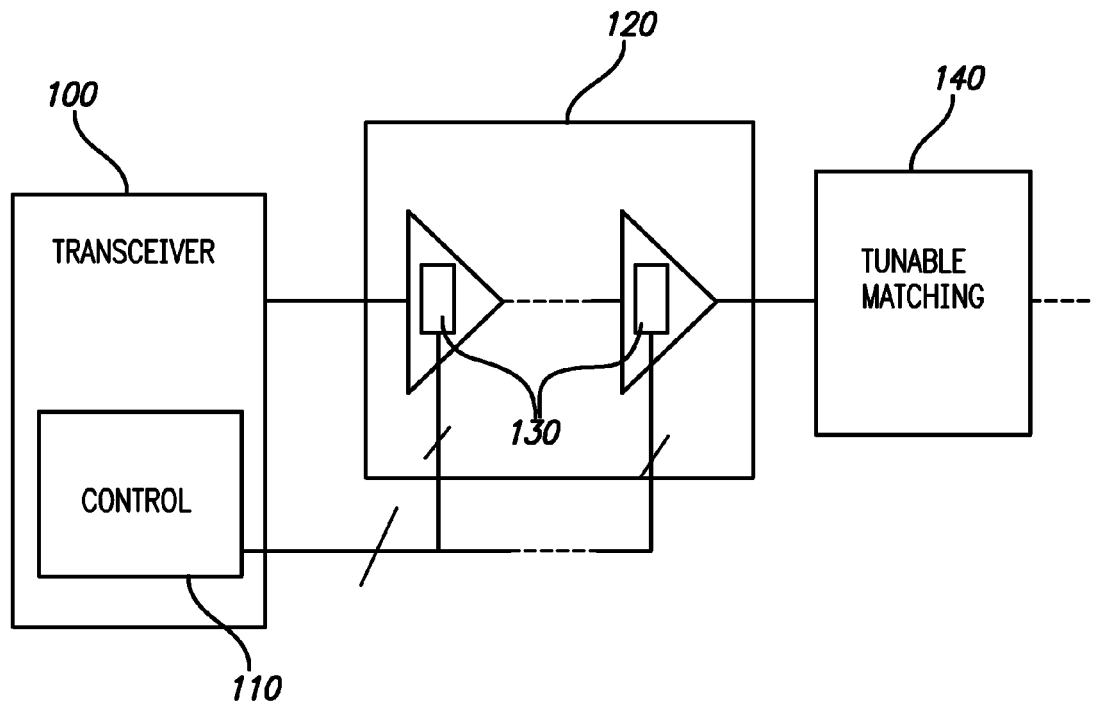
FIG. 1 shows a block diagram of a method in which a transceiver is used to provide an enable/disable signal to a selected number of amplifier unit cells.

FIG. 1 shows a block diagram of a method in which a transceiver (100) provides an enable/disable signal to a selected number of unit cells (130) within one or more amplifiers (120) through the use of a control network (110) located within the transceiver (100).

In FIG. 1, the transceiver (100) could be implemented using any number of different available transceivers known in the art. For example, the transceiver (100) could be an I-Q modulator followed by a variable gain or attenuation stage. The control network (110) in the transceiver (100) determines a power level of the signal to be transmitted and then sends a control signal to enable and/or disable appropriate unit cells (130) in the one or more amplifiers. Usually, the higher the power level of the signal, the higher the number of cells to be enabled. By enabling and/or disabling the unit cells (130) within the one or more amplifiers (120), the input signal, from the transceiver (100) can be amplified to different power levels to be provided to a tunable matching arrangement (140). The tunable matching arrangement (140) dynamically adjusts the output impedance seen by the one or more unit cells (130) from the one or more amplifiers (120). More information on tunable matching networks can be found, for example, in U.S. Pat. No. 7,795,968, issued on Sep. 14, 2010, which is incorporated herein by reference in its entirety.

The transceiver (100) shown in FIG. 1 can use a lookup table which would map an output power of the one or more amplifiers (120) to a particular set of scalable periphery and tunable matching (SPTM) combinations. Furthermore, a desired setting for the SPTM could be pre-characterized, for example, by a manufacturer or a vendor. When the transceiver (100) is required to change an output power level, the transceiver (100) finds the correct output power level in the lookup table and adjusts settings of the one or more amplifier accordingly.

Figure 2:
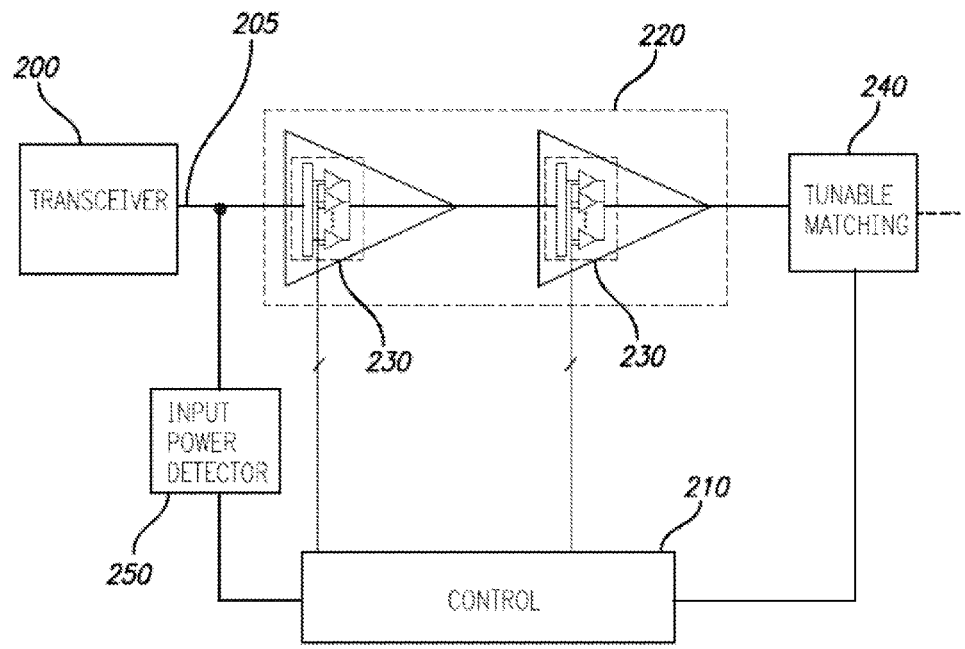
FIG. 2 shows a block diagram of an embodiment for scalable periphery architecture with a separate input power detector and control network to enable/disable a selected number of scalable amplifier unit cells.

FIG. 2 shows a block diagram of an embodiment for scalable periphery tunable matching (SPTM) circuit with an input power detector (250), to determine a power level of an input signal to the one or more amplifiers (220), and a control network (210) to send a control signal to the unit cells to enable a selected number of unit cells and/or disable a selected number of unit cells, based for example on the determined power level. Whereas in the configuration shown in FIG. 1, the control network (110) is located within the transceiver (100), the embodiment shown in FIG. 2 shows an input power detector (250) and a control network (210) separate from the transceiver (200). Based on the embodiment depicted by FIG. 2, the skilled person will recognize a feedforward control circuit which optimizes operation of the amplifier (220) based on an input signal power level to the amplifier, as detected by the input power detector (250). Related systems and methods for optimizing amplifier operation using feed-forward control can be found in, for example, U.S. patent application Ser. No. 13/828,121, entitled "Systems and Methods for Optimizing Amplifier Operations", filed on Mar. 14, 2013, which is incorporated herein by reference in its entirety.

In particular, each amplifier (220) contains a plurality of unit cells (230), which can be turned on or off to adjust the gain for a particular amplifier. For example, if the amplifier contains 64 unit cells, only 32 cells can be switched on for purposes of a specific signal to be amplified. Amplifiers with a selectable number of unit cells of which the amplifiers are made of are called "scalable periphery" amplifiers. More information on scalable periphery amplifiers is provided for example in U.S. patent application Ser. No. 13/797,779, entitled "Scalable Periphery Tunable Matching Power Amplifier", filed on Mar. 12, 2013, which is incorporated herein by reference in its entirety.

Should the amplifiers comprise, for example, 64 unit cells, then 64 control signals (e.g., enable/disable signals) can be connected from the control network to the unit cells of each amplifier. As the number of unit cells per power amplifier increases, under the method of implementation described above with reference to FIG. 1, there would be an increase in the complexity of processing for a transceiver to identify a power level needed to transmit an input signal as well as increased complexity to enable/disable appropriate unit cells. Likewise, given an increased complexity, implementation of a transceiver capable of performing the determination and enabling/disabling could consume more area on a die when fabricated.

On the other hand, FIG. 2 shows an implementation to determine a power level from an input signal from a transceiver (200) as well as enabling and/or disabling the unit cells (230) of the amplifiers (220) through a combined use of the input power detector (250) and the control network (210), such control network (210) being separate from the transceiver (200).

According to an embodiment of the disclosure, the input power detector (250) identifies a power level generated by the transceiver (200) to transmit the input signal (205). A logic system of the input power detector (250) can comprise multiple comparators, decoders and/or analog-to-digital converters. A circuit arrangement comprising the logic system can be implemented within the input power detector (250) to indicate the control network (210) to send control signals (e.g., enable/disable signal) to the unit cells. FIG. 2 provides a possible detailed implementation of the one or more amplifiers (220) by illustrating the separate unit cells within the one or more amplifiers (220) as well as logic lines from the control network (210) used to transmit the control signals.

The input power detector (250) determines the adjustments for the one or more amplifiers (220) as a whole. Thus, the only information needed to by the input power detector (250) is the input power to the one or more amplifiers (220). The subsequent adjustments to the unit cells (130) are predetermined on the basis of such input power information.

Figure 3:
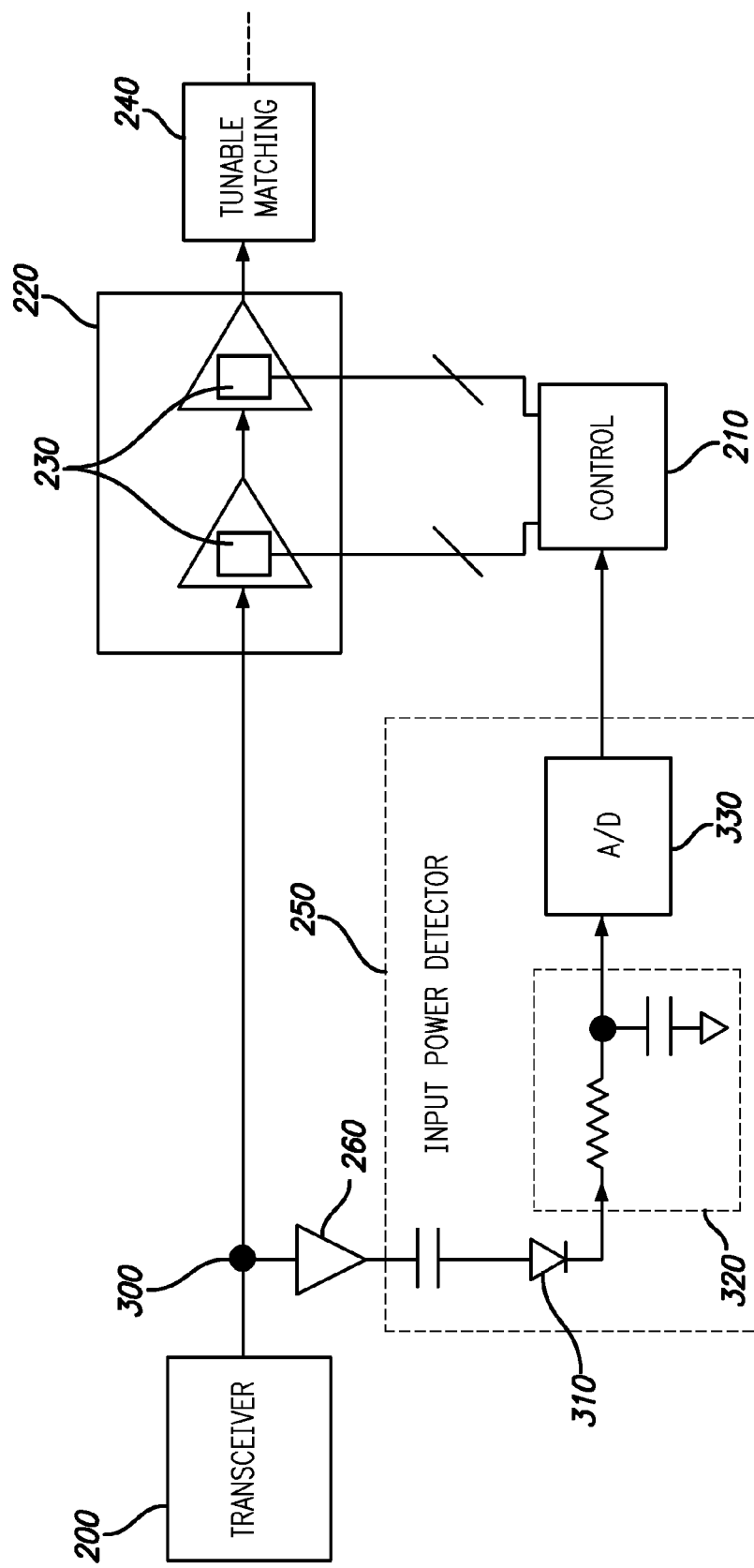
FIG. 3 shows a block diagram of an amplifier circuit coupled with an input power detector comprising an RF detector and a low-pass filter.

In an embodiment of the present disclosure, as shown in FIG. 3, a coupler (300) is provided, to divert a fraction of the output power to the input detector (250). The coupler (300) is associated with an amplifier (260) to increase the gain of the diverted input signal and with an RF detector. The RF detector can be, for example, a diode (310) followed by a low-pass filter (320). A person skilled in the art would understand that other implementations of the RF detector are possible which can include using, for example, an RMS detector or a full IQ demodulator.

As shown in FIG. 3, an output of the RF detector is fed through the low-pass filter (320) to an A/D converter (330) and a control network (210). The A/D converter (330) converts the analog input power level obtained from the coupler (300) into a digital signal, which is then provided to the control network (210). FIG. 3 illustrates the A/D converter (330) as being part of the input power detector (250). This would make sense because the input power detector (250) mainly operates using analog signals. However, the A/D converter (330) does not necessarily need to be included within the input power detector (250). The A/D converter (330) could be implemented within the control network (210) or as a separate component between the output from the input power detector (250) and the input to the control network (210).

As shown in FIG. 2 and FIG. 3, an output signal from the input power detector (250) is sent to the control network (210), where the control network (210) determines which unit cells (230) of the one or more amplifiers (220) to enable and/or disable based on a measurement of the input signal from the input power detector (250). The control network (210) then sends a control signal to each unit cell (230) belonging to the one or more amplifier (220), in order to enable or disable each of such unit cells (230).

In an embodiment of the present disclosure, the input power detector (250) and the control network (210) can be implemented on a same die separate from the transceiver (200). A combination of the input power detector (250) and the control network (210) can determine a power level and control signaling to enable and/or disable the unit cells in the one or more amplifiers (220). With the separation of the power level determination and unit cell control signal from the transceiver (200), the transceiver (200) no longer performs the power level detection and generation of the control signal which not only results in a simplification of the transceiver (200) but also in better scalability of the entire circuit. Consequently, the transceiver (200) of FIG. 2 and FIG. 3 will be able to operate without need to monitor the one or more amplifiers (220). Therefore, software simplification and a reduction of data writes from the transceiver to the one or more amplifiers can also be realized. In a further embodiment of the present disclosure, the amplifier (220), the input power detector (250) and the control network (210) can be monolithically integrated on a same die, thus providing an autonomous power amplifier, configurable by its own built-in circuits in response to changing output power requirements.

Figure 4:
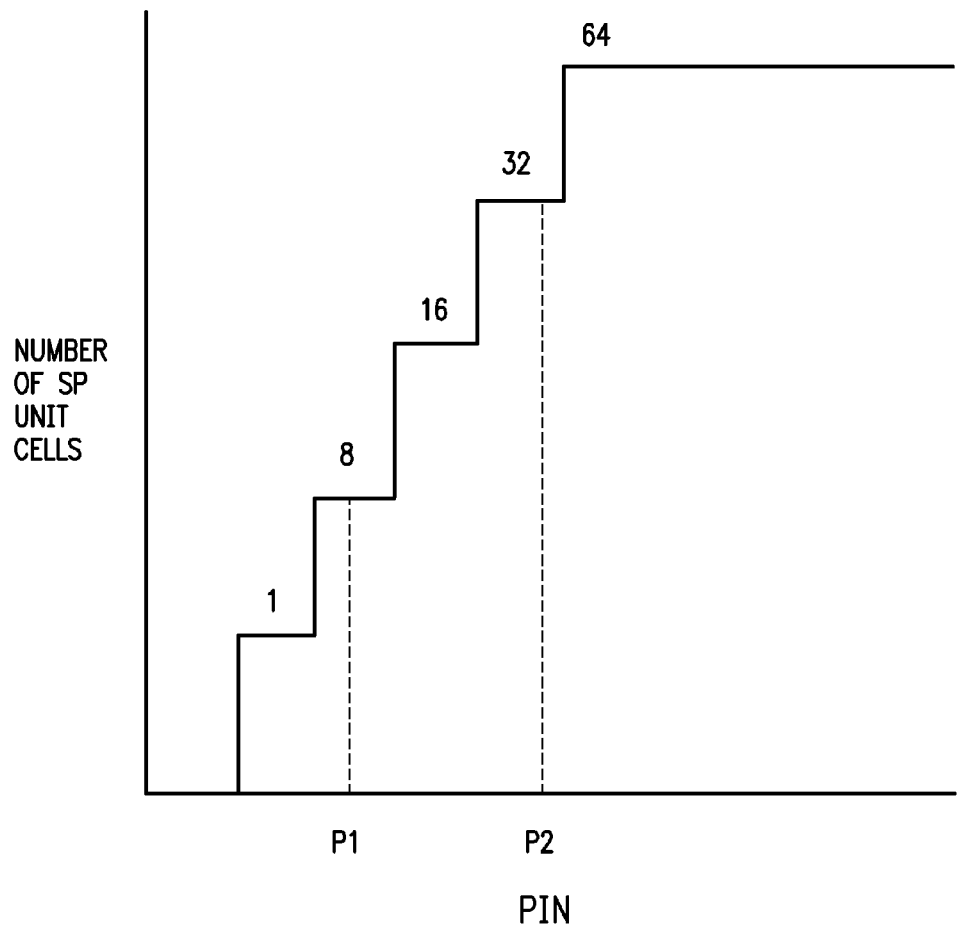
FIG. 4 is an example showing a relationship between enabled amplifier unit cells as a function of an input power of an amplifier to drive a given signal from a transceiver.

FIG. 4 is an exemplary graph showing a relationship between a number of enabled amplifier unit cells (230) as a function of an input power to an amplifier (220) to transmit an input signal from a transceiver (200). In order for the amplifiers to output a certain amount of power, a minimum number of unit cells may need to be enabled. In other words, a certain number of enabled unit cells can output a certain amount of output power, wherein a relationship exists between the number of enabled unit cells and amplifier amplification. In one embodiment of the present application, peripheries of the one or more amplifiers (220) are scaled proportionally to the output power thereby simulating a scalable periphery-type arrangement. For example, if the output power is reduced by 50%, the number of unit cells (230) of the one or more amplifiers (220) that are enabled can be reduced by 50% and the load line impedance can correspondingly be adjusted to higher impedance through the use of an output matching network with variable inductors and variable capacitors, for example the tunable matching networks (identified as 140 and 240 in FIG. 1 and FIG. 2, respectively). In other embodiments, it may be advantageous to also control bias voltage to the various unit cells of the amplifiers, with benefits ranging from better ACLR to reduced power consumption as further described in the afore mentioned reference U.S. patent application Ser. No. 13/797,779 which is incorporated herein by reference in its entirety. Accordingly, a bias voltage to a unit cell can be changed depending on the unit cell being enabled or disabled. According to further embodiments of the present disclosure, control and adjustment of the matching networks as well as the bias voltages to the various unit cells can be performed by the control unit (210) of FIGS. 2 and 3 (although not shown in FIGS. 2 and 3). Such controls can be performed independently to one another or in combination, and as a function of the detected input power to the amplifiers. Relationships tying such controls to the detected power level can be stored within memory-based lookup tables in the control unit (210).

In one embodiment of the present disclosure, in order to output the maximum power from the amplifier, all the possible unit cells can be enabled by the control network (210). As the power level to transmit the signal decreases, fewer unit cells can be enabled. The determination of the power level being output from the transceiver to drive the amplifier can be made by the input power detector (250), and such determined power level can be provided to the control network (210). As already briefly mentioned above, FIG. 4 shows a relationship between the number of unit cells (230) that could be enabled for a given power level of the input signal from the transceiver (200). By way of example and not of limitation, assuming a total number of 64 unit cells per amplifier, FIG. 4 shows that for a power level of P1, eight unit cells of the one or more amplifiers would be enabled to obtain the desired power level to transmit the input signal from the transceiver whereas, for example, for a power level of P2, thirty-two unit cells of the one or more amplifiers would be enabled to obtain the desired power level to transmit the input signal from the transceiver. Depending on the application, the relationship between the number of enabled unit cells vs. the input power level can be varied. Depending on the amount of linearity required, the number of enabled unit cells, the biases to the various unit cells and the load line (e.g. via the tunable match) can be adjusted as described before and further noted in the referenced U.S. patent application Ser. No. 13/797,779.

To determine a relationship between the input power of the amplifier (220) and the number of enabled/disabled amplifier unit cells (230), a calibration procedure can be performed. The relationship between the number of enabled amplifier unit cells (230) and the input power to the amplifier (220) can be determined by measuring the output of the RF detector (320) or the output of the A/D converter (330) as the input power to the amplifier (220) is varied. Starting, for example, from a higher power output, a ratio of a current A/D output to a reference high power level is computed as the output power of the amplifier is gradually reduced. Once a desired amount of power reduction is achieved, the control network (210) can note the number of enabled or disabled amplifier unit cells (230) needed to maintain a corresponding output power level and associate that number to the measured ratio or voltage of the AID output. Such relationship tying the number of enabled/disables unit cells to the input power to the amplifier (e.g. via output of A/D) can be stored in a memory-based lookup table contained within the control unit (210), or can be implemented using programmable logic gates residing within the control unit. Output of the A/D converter can then be used to feed the input of such circuits to get a corresponding output fed to the various enabling terminals of the amplifier unit cells. According to further embodiments of the present disclosure, such memory-based lookup table or programmable gates can also be used to control the tunable match (240) and the biasing circuits providing biasing voltages to the various unit cells according to the same input power level to the amplifier (220).

By way of example and not of limitation, a first switch point can be a reduction of 3 dB from the highest output power, while a second switch point can be a reduction of 6 dB from the highest output power, and a third switch point can be a reduction of 9 dB from the highest output power. In a similar manner, different switch points can be set in order to establish the enabled amplifier unit cell to input power relationship, as shown in FIG. 4. For each of the different switch points, by using the calibration described above, the control network (210) can identify the number of amplifier unit cells (230) which is desired to achieve that switch point so during later implementation of the amplifier arrangement, the control network (210) would be able to achieve the plurality of implemented switch points by enabling the appropriate number of amplifier unit cells (230).

The examples set forth above are provided to give those of ordinary skill in the art a complete disclosure and description of how to make and use the embodiments of the input power detecting arrangement and method of the disclosure, and are not intended to limit the scope of what the inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. An arrangement comprising:
   one or more power amplifiers, each power amplifier comprising a plurality of unit cells, the one or more power amplifiers adapted to amplify an input signal from a signal generator;
   an input power detector separate from the signal generator, the input power detector coupled with the signal generator and adapted to determine a power level of the input signal at an input of the one or more power amplifiers; and
   a control network separate from the signal generator and connected with the input power detector, the control network determining, upon receipt of the power level of the input signal, a number of unit cells to disable or enable and then send an individual control signal to each of the plurality of unit cells of each power amplifier to independently enable and/or disable the unit cells based on the determined number of unit cells and configured to adjust a tunable matching circuit operatively coupled to an output of one of the one or more power amplifiers and the control network based on the determined number of unit cells to disable or enable.

2. The arrangement according to claim 1, further comprising a transceiver adapted to generate the input signal to the one or more power amplifiers.

3. The arrangement according to claim 2, wherein the tunable matching circuit includes at least one variable inductor and at least one variable capacitor.

4. The arrangement according to claim 1, comprising a plurality of serially coupled power amplifiers, each power amplifier comprising a plurality of unit cells.

5. The arrangement according to claim 1, wherein the control network is further configured to adjust a bias voltage of a unit cell of the plurality of unit cells of the one or more power amplifiers based on the received power level of the input signal.

6. The arrangement according to claim 1, wherein the control network is further configured to adjust a bias voltage of a unit cell of the plurality of unit cells of the one or more power amplifiers based on the unit cell being enabled or disabled.

7. The arrangement according to claim 1, wherein the tunable matching circuit is configured to balance load line impedance based on the number of unit cells disabled or enabled in the one or more power amplifiers.

8. The arrangement according to claim 1, wherein the input power detector comprises:
an RF detector;
a coupler adapted to couple a fraction of the input signal to the RF detector; and
a low-pass filter connected to an output of the RF detector.

9. The arrangement according to claim 8, wherein the RF detector is a diode.

10. The arrangement according to claim 8, wherein the low-pass filter comprises a resistor connected between an output of the RF detector and the control network, and a capacitor connected between an output of the resistor and ground.

11. The arrangement according to claim 1, wherein the control network is calibrated to associate a number of enabled or disabled amplifier unit cells with respect to a particular power level.

12. The arrangement according to claim 11, wherein calibration data to associate the number of enabled or disabled amplifier unit cells with respect to the particular power level are stored in one of: a) a memory-based lookup table, and b) programmable logic gates.

13. A method comprising:
generating an input signal from a signal generator;
providing one or more power amplifiers adapted to amplify the generated input signal, wherein each power amplifier comprises a plurality of unit cells;
feeding the input signal to an input power detector;
detecting a power level from the fed input signal;
determining an amplification level for the one or more power amplifiers based on the detected power level;
sending control signals to one or more unit cells of the plurality of unit cells of the one or more power amplifiers to enable or disable one or more unit cells, which control the amplification level with respect to the detected power level;
adjusting the impedance of a tunable matching circuit operatively coupled to an output of one of the one or more power amplifiers based on the unit cells to disabled or enabled; and
amplifying the input signal through the enabled unit cells of the one or more power amplifiers.

14. The method according to claim 13, further comprising:
adjusting a bias voltage of a unit cell of the one or more unit cells based on the unit cell being enabled or disabled.

15. The method according to claim 13, wherein the tunable matching circuit includes at least one variable inductor and at least one variable capacitor.

16. The method according to claim 13, comprising providing a plurality of serially coupled power amplifiers adapted to amplify the generated input signal, wherein each power amplifier comprises a plurality of unit cells and sending control signals to one or more unit cells of the plurality of unit cells of the plurality of serially coupled power amplifiers to enable or disable one or more unit cells.

17. The method according to claim 13, wherein the detecting and the determining are performed on a same die separate from the signal generator.

18. The method according to claim 13, further comprising calibrating a control network to associate a desired number of unit cells for a particular amplification level to be used based on the detected power level.

19. The method according to claim 18, wherein the calibrating further comprises:
running a calibration routine;
based on the running, generating calibration data which determine a number of unit cells to enable or disable with respect to an input power; and
storing the calibration data.

20. An arrangement comprising:
a plurality of serially coupled power amplifiers, each power amplifier comprising a plurality of unit cells, the plurality of serially coupled power amplifiers adapted to amplify an input signal from a signal generator;
an input power detector separate from the signal generator, the input power detector coupled with the signal generator and adapted to determine a power level of the input signal at an input of the plurality of serially coupled power amplifiers; and
a control network separate from the signal generator and connected with the input power detector, the control network determining, upon receipt of the power level of the input signal, a number of unit cells to disable or enable and then send an individual control signal to each of the plurality of unit cells of each power amplifier to independently enable and/or disable the unit cells based on the determined number of unit cells.

21. The arrangement according to claim 20, the control network further configured to adjust a tunable matching circuit operatively coupled to an output of one of the plurality of serially coupled power amplifiers and the control network, based on the determined number of unit cells to disable or enable.

22. The arrangement according to claim 21, further comprising a tunable matching circuit to balance load line impedance based on the number of unit cells disabled or enabled in the one or more power amplifiers.

23. The arrangement according to claim 22, wherein the tunable matching circuit includes at least one variable inductor and at least one variable capacitor.

\* \* \* \* \*